United States Patent
Alagry et al.

(10) Patent No.: US 11,095,329 B1
(45) Date of Patent: Aug. 17, 2021

(54) FILTER AND AMPLIFICATION CIRCUIT FOR OUTPUTTING ULTRA-WIDE BAND (UWB) RADIO FREQUENCY (RF) SIGNALS WITH A HIGH SPURIOUS-FREE DYNAMIC RANGE, TEST SYSTEM AND METHODS

(71) Applicant: GLOBALFOUNDRIES U.S. Inc., Malta, NY (US)

(72) Inventors: Ahmad Alagry, Williston, VT (US); Mustapha Slamani, South Burlington, VT (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 0 days.

(21) Appl. No.: 16/853,969

(22) Filed: Apr. 21, 2020

(51) Int. Cl.
*H04B 1/18* (2006.01)
*H03H 11/34* (2006.01)
*H04B 17/00* (2015.01)
*H04B 1/10* (2006.01)
*H04B 1/00* (2006.01)

(52) U.S. Cl.
CPC .............. *H04B 1/18* (2013.01); *H03H 11/342* (2013.01); *H04B 1/0057* (2013.01); *H04B 1/10* (2013.01); *H03F 2200/451* (2013.01)

(58) Field of Classification Search
CPC . H04B 1/16; H04B 1/18; H04B 1/005; H04B 1/0057; H04B 1/006; H04B 1/10; H04B 1/04; H04B 1/0458; H04B 1/0483; H04B 17/00; H04B 17/0085; H03H 11/342; H03H 11/344; H03H 11/348; H03F 2200/451
See application file for complete search history.

(56) References Cited

U.S. PATENT DOCUMENTS

| | | | |
|---|---|---|---|
| 7,302,237 B2 | 11/2007 | Jackson et al. | |
| 8,314,604 B2 | 11/2012 | Mitchell et al. | |
| 9,461,636 B2 | 10/2016 | Ensinger et al. | |
| 9,874,640 B2 | 1/2018 | Pearse et al. | |

(Continued)

OTHER PUBLICATIONS

J. Ostermeier, "Selecting a Signal Generator for Testing AD Converters," Application Note, Rohde & Schwarz, 12.2010-1.01, pp. 1-84.

(Continued)

*Primary Examiner* — Blane J Jackson
(74) *Attorney, Agent, or Firm* — Gibb & Riley, LLC; Anthony J. Canale

(57) ABSTRACT

Disclosed is a filter and amplification circuit including a first switch with a single input and multiple outputs, a second switch with multiple inputs and a single output, and signal paths (each with an amplifier and band pass filter) between the outputs of the first switch and the inputs of the second switch, respectively. During filtering, the input of the first switch receives a radio frequency (RF) signal and filtering is performed through a combination of a selected signal path (which is active and has its amplifier enabled) and non-selected signal paths (which are passively coupled to the selected signal path and have their amplifiers disabled). Isolation is provided by the switches (e.g., solid-state switches) and the amplifiers, ensuring that the filtered RF signal at the single output of the second switch has a desired high spurious-free dynamic range (SFDR). Also disclosed are a test system and associated methods.

19 Claims, 5 Drawing Sheets

(56) References Cited

U.S. PATENT DOCUMENTS

| | | | |
|---|---|---|---|
| 10,050,653 B2* | 8/2018 | Pehlivanoglu | H04B 1/0057 |
| 10,326,484 B1* | 6/2019 | Ayranci | H04B 1/006 |
| 2018/0138930 A1* | 5/2018 | King | H04B 1/0057 |
| 2019/0312553 A1* | 10/2019 | Kim | H03F 1/26 |

OTHER PUBLICATIONS

Brannon et al., "Understanding High Speed ADC Testing and Evaluation," Analog Devices, AN-835, Application Note, pp. 1-24.

Maxim Integrated, "Dynamic Testing of High-Speed ADCs, Part 2," Tutorial 729, 2002, pp. 1-17.

Maxim Integrated, "Selecting the Optimum Test Tones and Test Equipment for Successful High-Speed ADC Sinewave Testing," Tutorial 1819, 2002, pp. 1-9.

Keysight Technologies, "87104/6D Multiport Electromechanical Coaxial Switches DC to 40 GHz", Technical Overview, 2015, pp. 1-12.

\* cited by examiner

FILTER AND AMPLIFICATION CIRCUIT FOR OUTPUTTING ULTRA-WIDE BAND (UWB) RADIO FREQUENCY (RF) SIGNALS WITH A HIGH SPURIOUS-FREE DYNAMIC RANGE, TEST SYSTEM AND METHODS

BACKGROUND

Field of the Invention

The present invention relates to radio frequency (RF) signal filtering and, more particularly, to embodiments of a filter and amplification circuit for generating ultra-wide band (UWB) RF signals with a high spurious-free dynamic range (SFDR), a test system that incorporates the filter and amplification circuit and to associated methods.

Description of Related Art

The radio spectrum includes radio frequency (RF) signals with frequencies ranging from Hz 3 Hz to 3 THz. The millimeter wave band (mmWave band) is a sub-band within the radio spectrum and includes RF signals with frequencies ranging from 24 GHz to 300 GHz. The wavelengths of the RF signals within this mmWave band range from 1 mm at 300 GHz to 10 mm at 30 GHz (hence the name). $4^{th}$ generation (4G) wireless communication networks operate at or below 6 GHz. Developing $5^{th}$ generation (5G) wireless communication networks are being designed to operate in an ultra-wide band (UWB), which includes the same sub-6 GHz band previously covered by 4G wireless communication networks and a lower portion of the mmWave band (e.g., 24 GHz to 100 GHz). However, operation of 5G wireless communication networks in this UWB raises issues not previously encountered with operation of 4G wireless communication networks within the sub-6 GHz band alone. Specifically, some devices that are incorporated into 5G wireless communication networks (e.g., RF integrated circuits (ICs) and analog-to-digital converters (ADCs) with very high data rates at 64 GSPS or more) may have testing specifications that require relatively pure RF signals (i.e., RF signals that have relatively low harmonic and non-harmonic distortion). For example, testing specifications for such devices may require an RF signal at a specific frequency (e.g., 10 GHz, 20 GHz, 30 GHz, 40 GHz, etc.) within the 5G UWB and may further require that the RF signal has a high spurious-free dynamic range (SFDR). The RF signal that is generated by and output from an RF signal generator will typically include a carrier signal (also referred to herein as a fundamental signal) at the specific frequency as well as one or more spurious signals (i.e., unintended signals that are the result of harmonics, etc.). The SFDR of the RF signal refers to the strength ratio of the carrier signal relative to the spurious signal(s). However, existing RF signal generators are incapable of producing such a pure RF signal within the 5G UWB.

SUMMARY

In view of the foregoing, disclosed herein are embodiments of a radio frequency (RF) signal filter and amplification circuit for generating an ultra-wide band (UWB) RF signal with a high spurious-free dynamic range (SFDR) (e.g., at −80 dBc or higher). Similar to prior art filter circuits, the disclosed filter and amplification circuit embodiments can include a first RF switch with a single input and multiple outputs, a second RF switch with multiple inputs and a single output, and multiple signal paths (each including a band pass filter) extending between the outputs of the first RF switch and the inputs of the second RF switch, respectively. During a filtering operation, the single input of the first RF switch receives an RF signal and filtering is performed through a selected signal path (which is active) in combination with non-selected signal paths (which are passively coupled to the selected signal path) so that a filtered RF signal output at the single output of the second RF switch has an increased SFDR level. To avoid the disadvantages associated with the use of electromechanical RF switches as seen in the prior art filter circuits, the disclosed filter and amplification circuit embodiments can employ solid-state RF switches and, particularly, surface-mount solid-state RF switches instead of electromechanical RF switches. Those skilled in the art will recognize that surface-mount solid-state RF switches may not provide a sufficient amount of isolation on their own to achieve the desired high SFDR. However, the disclosed filter and amplification circuit embodiments also incorporate an amplifier, such as a surface-mount low noise amplifier (LNA), in each signal path. During the filtering operation, the amplifier in the selected signal path is enabled and provides amplification and some amount of isolation, whereas the amplifiers in the non-selected signal paths are disabled, providing no amplification but a sufficiently large amount of isolation to ensure that the filtered RF signal has the desired SFDR (e.g., at −80 dBc or higher). Also disclosed herein are embodiments of a test system that incorporates the RF signal filter and amplification circuit and embodiments of associated methods.

More particularly, disclosed herein are embodiments of a radio frequency (RF) signal filter and amplification circuit for generating an ultra-wide band (UWB) RF signal with a high spurious-free dynamic range (SFDR) (e.g., at −80 dBc or higher). The filter and amplification circuit can include a first RF switch and a second RF switch. The first RF switch can have a single first input and multiple first outputs. The second RF switch can have multiple second inputs and a single second output. The first and second RF switches can be, for example, solid-state RF switches and, particularly, surface-mount solid-state RF switches. The filter and amplification circuit can further include multiple different signal paths, which electrically connect the multiple first outputs of the first RF switch to the multiple second inputs of the second RF switch, respectively. Each of these signal paths can include an amplifier and a band pass filter connected in series between a corresponding first output of the first RF switch and a corresponding second input of the second RF switch. The different signal paths can include different band pass filters that pass RF signals within different bands, respectively. For example, a first band pass filter in a first signal path can pass RF signals within a first band and suppress all RF signals outside that first band; a second band pass filter in a second signal path can pass RF signals within a second band and suppress all RF signals outside the second band; and so on.

To initiate a filtering operation, the single first input of the first RF switch can receive an RF signal (e.g., from an RF signal generator). This RF signal can have a relatively low SFDR. That is, the RF signal can include a carrier signal at a specific frequency and multiple spurious signals at different frequencies with each spurious signal having an initial corresponding negative power ratio relative to the carrier signal that is relatively low (e.g., lower than −80 dBc, such as at −60 dBc or lower). Additionally, the filter and amplification circuit can receive multiple control signals including a signal path select signal and multiple amplifier enable/ disable signals. Specifically, the first RF switch and the second RF switch can receive the signal path select signal, which cause a selected one of the signal paths to be electrically connected to the single first input of the first RF switch and to the single second output of the second RF switch. The selected signal path will be that signal path that contains the specific band pass filter, which will pass the carrier signal and suppress the spurious signals. Furthermore, the amplifiers in each signal path can receive corresponding enable/disable signals, which cause the amplifier in the selected signal path to be enabled and which further cause each amplifier in each non-selected signal path to be disabled.

Filtering can then be performed through the selected signal path (which is active and has its amplifier enabled) in combination with the non-selected signal paths (which are passively coupled to the selected signal path and have their amplifiers disabled) so that a filtered RF signal is output at the single second output of the second RF switch. The filtered RF signal can include an amplified and filtered carrier signal at the specific frequency and multiple filtered spurious signals at the different frequencies with each filtered spurious signal having a higher corresponding negative power ratio relative the carrier signal as compared to the initial corresponding negative power ratio. This increased power ratio can be relatively high (e.g., at −80 dBc or higher).

More specifically, within the selected signal path, the amplifier can receive the RF signal and can generate and output an amplified RF signal to the band pass filter. The band pass filter can process the amplified RF signal such that the filtered RF signal at an output segment of the selected signal path includes the amplified and filtered carrier signal at the specific frequency. Furthermore, the input segment of each non-selected signal path can be passively coupled to the input segment of the selected signal path such that the RF signal is also received by the input segment of each of the non-elected signal paths. Within each non-selected signal path, the disabled amplifier can forward the RF signal without amplification to the band pass filter. The band pass filter can process the RF signal such that the output of the band pass filter in each non-elected signal path is a filtered (but not amplified) spurious signal at a corresponding one of the different frequencies. Finally, the output segment of each non-selected signal path can also be passively coupled to the output segment of the selected signal path such that each filtered spurious signal is received by the output segment of the selected signal path. Thus, the filtered RF signal can also include the multiple filtered spurious signals. It should be noted that the higher corresponding negative power ratio of a given filtered spurious signal can be at −80 dBc or higher due to isolation between the selected signal path and the given non-selected signal path that generates the given filtered spurious signal. Such isolation is provided by the first RF switch, the amplifier that is enabled in the selected signal path, the amplifier that is disabled in the given non-selected signal path, and the second RF switch.

Also disclosed herein are embodiments of a test system that incorporates the above-described radio frequency (RF) signal filter and amplification circuit for generating an ultra-wide band (UWB) RF signal with a high spurious-free dynamic range (SFDR) (e.g., at −80 dBc or higher) for use in testing a device under test (DUT). Specifically, the test system can include an RF signal generator that generates and outputs an RF signal. The RF signal can include a carrier signal at a specific frequency and multiple spurious signals at different frequencies with each spurious signal having an initial corresponding negative power ratio relative to the carrier signal and this power ratio can be relatively low (e.g., lower than −80 dBc). Thus, the RF signal has a low SFDR. The test system can further include the above-described filter and amplification circuit, which receives the RF signal from the RF signal generator, which filters the RF signal so to generate a filtered RF signal that includes an amplified and filtered carrier signal at the specific frequency and multiple filtered spurious signals at the different frequencies with each filtered spurious signal having a higher corresponding negative power ratio relative the carrier signal as compared to the initial corresponding negative power ratio (e.g., at −80 dBc or higher). Thus, the filtered RF signal has a high SFDR. The filter and amplification circuit can further output the filtered RF signal to a DUT for use during testing.

Also disclosed herein are method embodiments associated with the above-described radio frequency (RF) signal filter and amplification circuit and test system. Specifically, the method can include receiving, by an RF signal filter and amplification circuit (as described above) from an RF signal generator, an RF signal. This RF signal can include carrier signal at a specific frequency and multiple spurious signals at different frequencies with each spurious signal having an initial low corresponding negative power ratio relative to the carrier signal (e.g., lower than −80 dBc). Thus, the RF signal has a low SFDR. The method can further include filtering, by the filter and amplification circuit, of the RF signal in order to output a filtered RF signal that includes an amplified and filtered carrier signal at the specific frequency and multiple filtered spurious signals at the different frequencies with each filtered spurious signal having a higher corresponding negative power ratio relative the carrier signal as compared to the initial corresponding negative power ratio (e.g., at −80 dBc or higher). Thus, the filtered RF signal has a high SFDR. The method can further include forwarding the filtered RF signal to a device under test (DUT) for use during testing.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned, some devices that are incorporated into 5G wireless communication networks (e.g., RF integrated circuits (ICs) and analog-to-digital converters (ADCs) with very high data rates at 64 GSPS or more) may have testing specifications that require relatively pure RF signals (i.e., RF signals that have relatively low harmonic and non-harmonic distortion). For example, testing specifications for such devices may require an RF signal at a specific frequency (e.g., 10 GHz, 20 GHz, 30 GHz, 40 GHz, etc.) within the 5G UWB and may further require that the RF signal has a high spurious-free dynamic range (SFDR). For example, testing specifications for such devices may require an RF signal at a given frequency (e.g., 10 GHz, 20 GHz, 30 GHz, 40 GHz, etc.) within the 5G UWB and may further require that the RF signal has a high spurious-free dynamic range (SFDR). The RF signal that is generated by and output from an RF signal generator will typically include a carrier signal (also referred to herein as a fundamental signal) at the specific frequency as well as one or more spurious signals (i.e., unintended signals that are the result of harmonics, etc.). The SFDR of the RF signal refers to the strength ratio of the carrier signal relative to the spurious signal(s). The high SFDR requirement for testing can be in the order of −80 dBc or higher, where dBc refers to the power ratio of any given spurious signal relative to the carrier signal. Those skilled in the art will recognize that a positive dBc value is used when the spurious signal has a higher power level than the carrier signal and a negative dBc value is used when the spurious signal has a lower power level than the carrier signal.

Figure 1A:
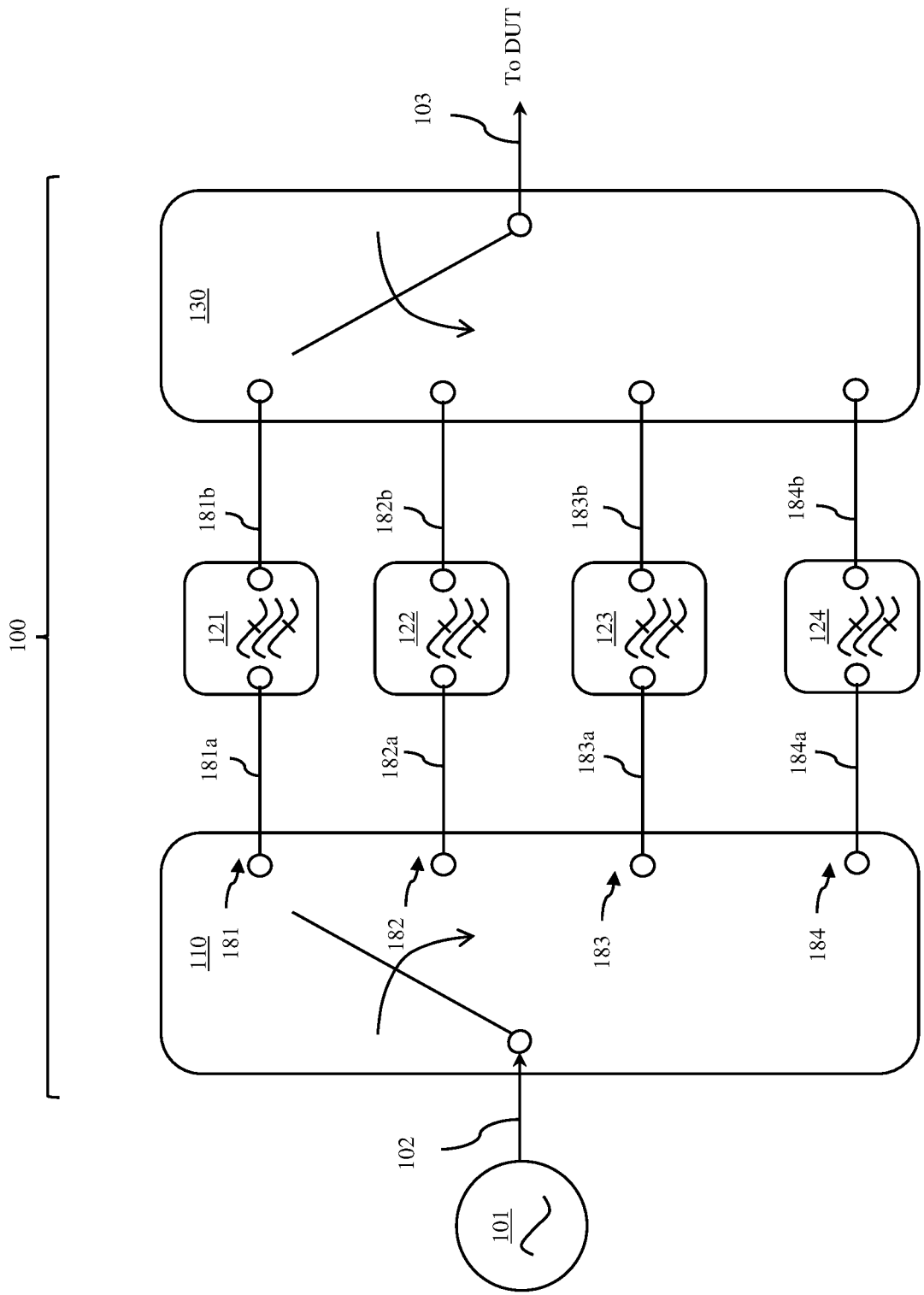
FIG. 1A is a schematic diagram illustrating a prior art filter circuit.
Figure 1B:
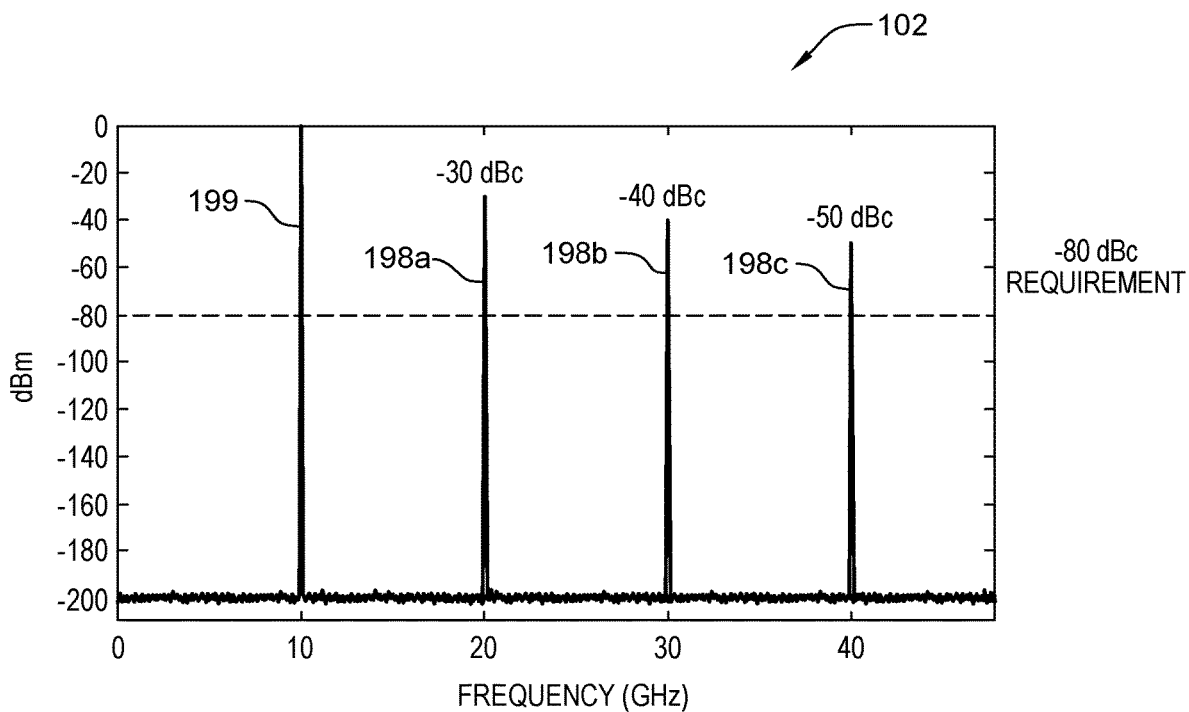
FIG. 1B is a graph illustrating an exemplary radio frequency (RF) signal, including carrier and spurious signals, input into the filter circuit of FIG. 1A.

Commercially available 5G UWB RF signal generators, such as the RF signal generator 101 shown in FIG. 1A, typically generate and output an RF signal 102 that includes a carrier signal 199, which is at a specific frequency within the UWB, and one or more spurious signals, which are at other frequencies within the UWB and which have power ratios relative to the carrier signal 199 in the order of −60 dBc or lower. For example, FIG. 1B is a graph illustrating an exemplary RF signal 102 that includes: a carrier signal 199, which is at 10 GHz; a first spurious signal 198a at 20 GHz with a −30 dBc power ratio relative to the carrier signal 199; a second spurious signal 198b at 30 GHz with a −40 dBc power ratio relative to the carrier signal 199; and a third spurious signal 198c at 40 GHz with a −50 dBc power ratio relative to the carrier signal 199. Thus, the power ratios of the spurious signals 198a-198c relative to the carrier signal 199 within in the RF signal 102 are lower than the minimum required −80 dBc and the RF signal 102 would be considered to have a low SFDR.

The filter circuit 100, also shown in FIG. 1A, is one existing solution employed to increase the SFDR of the RF signal 102 to −80 dBc or higher. This filter circuit 100 incorporates: a single input/multi-output electromechanical RF switch 110; a multi-input/single output electromechanical RF switch 130; and multiple signal paths 181-184, where each signal path includes a band pass filter 121-124 from a bank of multiple different band pass filters and is connected between a corresponding output port of the electromechanical RF switch 110 and a corresponding input port of the electromechanical RF switch 130. Within the bank, a first band pass filter 121 can be configured to pass only RF signals within a first band (e.g., 5-15 GHz), a second band pass filter 122 configured to pass only RF signals within a second band (e.g., 15-25 GHz), a third band pass filter 123 configured to pass only RF signals within a third band (e.g., 25-35 GHz), fourth band pass filter 124 configured to pass only RF signals within a fourth band (e.g., 35-45 GHz), etc. The two electromechanical RF switches 110 and 130 can be selectively operable in conjunction with each other in order to select one of the signal and, thereby establish an active signal path (also referred to herein as an active channel) from the single input port of the single input/multi-output electromechanical RF switch 110 through one of the band pass filters 121-124 and out the single output port of the multi-input/single output electromechanical RF switch 130.

In operation, the selected signal path will depend upon the frequency of the carrier signal 199 within the RF signal 102. For example, if the carrier signal 199 is at 10 GHz, as illustrated, then the selected signal path will be signal path 181, which includes the first band pass filter 121 because, as mentioned above, the band pass filter 121 is configured to pass only RF signals within the band from 5-15 GHz (i.e., is configured to suppress the spurious signals 198a-198c). As a result, the filtered RF signal 103 will include a filtered carrier signal 199' at 10 GHz and at essentially the same power level. While ideally the filter RF signal 103 would only include the filtered carrier signal 199', all non-selected signal paths 182-184 (referred to herein as coupling signal paths or channels or passive signal paths or channels) will be passively coupled to the selected signal path 181 with some known amount of isolation due to the electromechanical RF switches 110 and 130. As a result, the filtered RF signal 103 will also include the filtered spurious signals 198a', 198b' and 198c' but at increased power ratios relative to the carrier signal.

Specifically, each signal path can include an input segment from the electromechanical RF switch 110 to a given band pass filter and output segment from that given band pass filter to the electromechanical RF switch 110. Thus, the selected signal path 181 can include the input segment 181a, which forwards the RF signal 102 from the electromechanical RF switch 110 to the first band pass filter 121, and the output segment 181b, which receives only the filtered carrier signal 199' from the first band pass filter 121. All non-selected signal paths 182-184 will be passive signal paths that are passively coupled to the selected signal path 181. For example, the non-selected signal path 182 can include the second band pass filter 122 and the input segment 182a to and the output segment 182b from the second band pass filter 122. The non-selected signal path 183 can include the third band pass filter 123 and the input segment 183a to and the output segment 183b from the third band pass filter 123. The non-selected signal path 184 can include the fourth band pass filter 124 and the input segment to 184a and the output segment from 184b the fourth band pass filter.

There will be passive coupling between the input segment 181a of the selected signal path and the input segments 182a, 183a and 184a of the non-selected signal paths such that those input segments 182a, 183a and 184a each also received the RF signal 102. However, due to isolation provided by the electromechanical RF switch 110 (e.g., 60 dB), the negative power ratios relative to the carrier signal 199 will be increased by 60 dB. That is, the signals 199 and 198a-198c received by the input segments 182a, 183a and 184a of the non-selected signal paths 182-184 due to passive couple will have negative power ratios that are higher by 60 dB. The second, third and fourth band pass filters 122, 123 and 124 will perform the appropriate filtering processes in the non-selected signal paths 182-184 such that the output segments 182b, 183b and 184b of each of the non-selected signal paths receive filtered spurious signals 198a', 198b' and 198c' from the second, third and fourth band pass filter 122, 123, and 124, respectively. Finally, there will also be passive coupling between the output segment 181b of the selected signal path and the output segments 182b, 183b and 184b of the non-selected signal paths such that the output segment 181b of the selected signal path receives the filtered spurious signals 198a', 198b' and 198c' and, as a result, the filtered RF signal 103 includes, not only the filtered carrier signal 199', but also the filtered spurious signals 198a-198c. However, due to isolation provided by the electromechanical RF switch 130 (e.g., 60 dB), the negative power ratios will be increased by an additional 60 dB. Thus, the total increase of the negative power ratios of the filtered spurious signals 198a', 198b', and 198c' relative to the original carrier signal 199 due to the combined isolation amounts provided by the two electromechanical RF switches 110 and 130 will be 120 dB (i.e., 60 dB+60 dB).

Figure 1C:
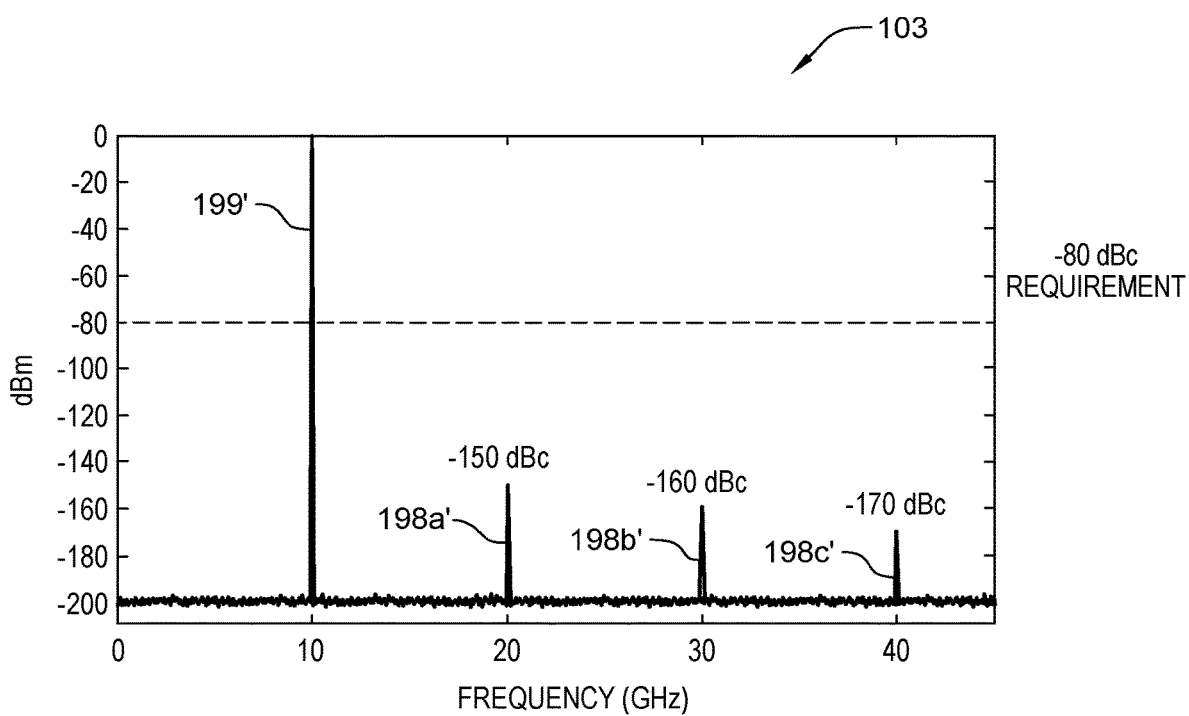
FIG. 1C is a graph illustrating an exemplary filtered RF signal, including filtered carrier and spurious signals, output from the filter circuit of FIG. 1A.

Consequently, as illustrated in FIG. 1C, the filtered RF signal 103 will include the filtered carrier signal 199', which is at essentially the same power level as in the original carrier signal 199', and also the filtered spurious signals 198a', 198b', and 198c', which are all now at lower power levels and, more particularly, which all now have negative power ratios relative to the original carrier signal that are higher than −80 dBc (e.g., −150 dBc, −160 dBc and −170 dBc, respectively). Unfortunately, while the electromechanical RF switches 110 and 130 provide sufficiently high isolation for the filter circuit 100 to achieve the desired final result (i.e., generation of UWB RF signals with a high SFDR), there are a number of disadvantages associated with the use of the electromechanical RF switches 110 and 130. For example, the cost of electromechanical RF switches is relatively high and electromechanical RF switches are also quite large. Additionally, the switching speeds of electromechanical RF switches are relatively slow because hot switching is not an option and the actual switching process performed by electromechanical switches RF can generate audible clicking noises.

In view of the foregoing, disclosed herein are embodiments of a radio frequency (RF) signal filter and amplification circuit for generating an ultra-wide band (UWB) RF signal with a high spurious-free dynamic range (SFDR) (e.g., at −80 dBc or higher). Similar to prior art filter circuits, the disclosed filter and amplification circuit embodiments can include a first RF switch with a single input and multiple outputs, a second RF switch with multiple inputs and a single output, and multiple signal paths (each including a band pass filter) extending between the outputs of the first RF switch and the inputs of the second RF switch, respectively. During a filtering operation, the single input of the first RF switch receives an RF signal and filtering is performed through a selected signal path (which is active) in combination with non-selected signal paths (which are passively coupled to the selected signal path) so that a filtered RF signal output at the single output of the second RF switch has an increased SFDR level. To avoid the disadvantages associated with the use of electromechanical RF switches as seen in the prior art filter circuits, the disclosed filter and amplification circuit embodiments can employ solid-state RF switches and, particularly, surface-mount solid-state RF switches instead of electromechanical RF switches. Those skilled in the art will recognize that surface-mount solid-state RF switches may not provide a sufficient amount of isolation on their own to achieve the desired high SFDR. However, the disclosed filter and amplification circuit embodiments also incorporate an amplifier, such as a surface-mount low noise amplifier (LNA), in each signal path. During the filtering operation, the amplifier in the selected signal path is enabled and provides signal amplification and some amount of isolation, whereas the amplifiers in the non-selected signal paths are disabled, providing no amplification but a sufficiently large amount of isolation to ensure that the filtered RF signal has the desired SFDR (e.g., at −80 dBc or higher). Also disclosed herein are embodiments of a test system that incorporates the RF signal filter and amplification circuit and embodiments of associated methods.

Figure 2A:
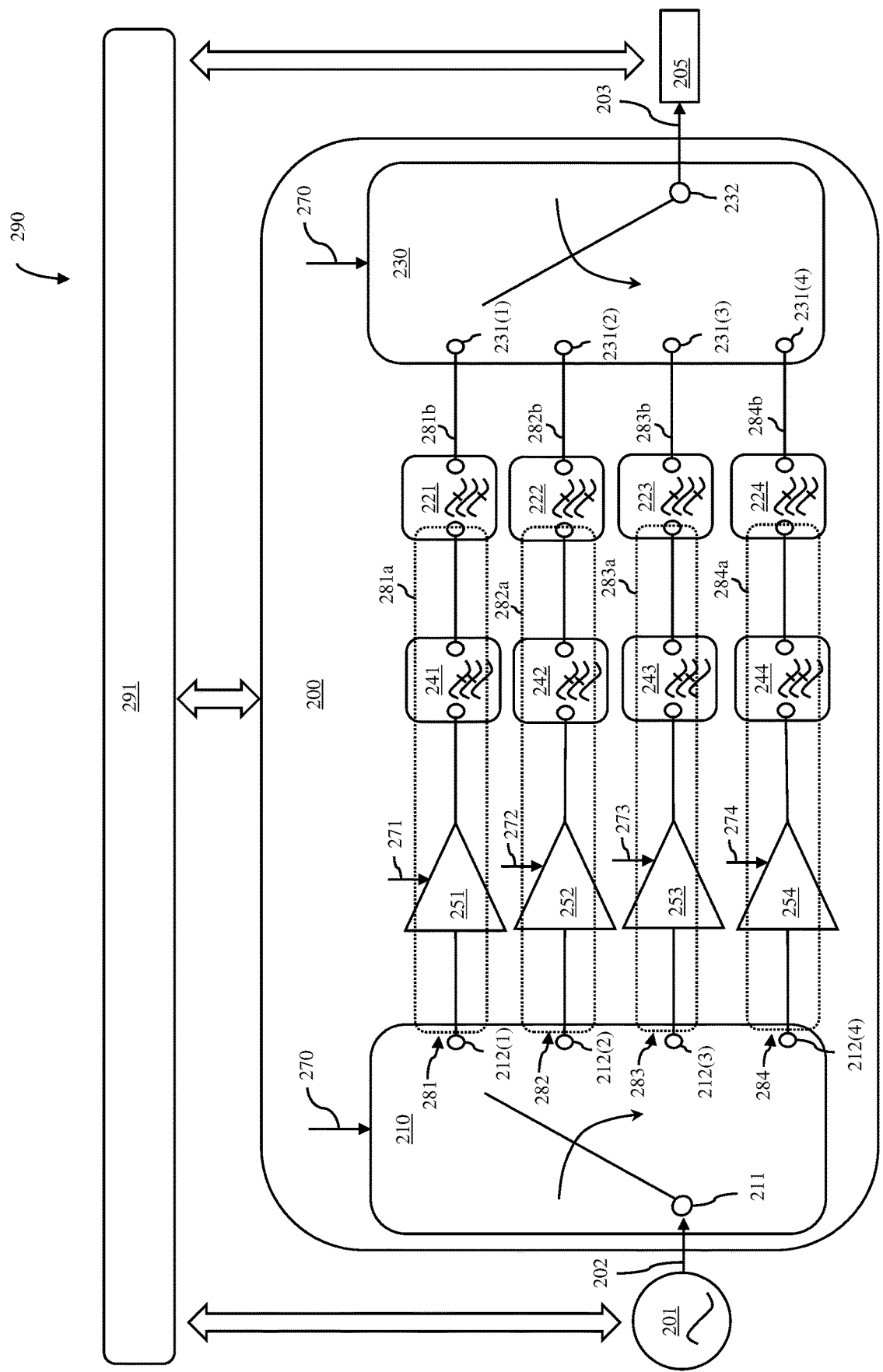
FIG. 2A is a schematic diagram illustrating disclosed embodiments of a filter and amplification circuit and of a test system incorporating the filter and amplification circuit.

More particularly, referring to FIG. 2A disclosed herein are embodiments of a radio frequency (RF) signal filter and amplification circuit 200 for generating an ultra-wide band (UWB) radio frequency (RF) signal with a high spurious-free dynamic range (SFDR) (e.g., at −80 dBc or higher) as well as embodiments of an exemplary test system 290 that can incorporate such a filter and amplification circuit 200.

The filter and amplification circuit 200 can include a first RF switch 210 and a second RF switch 230. The first RF switch 210 can have a single first input 211 and multiple first outputs 212(1)-212(4). Such a switch 210 can be configured so that a received signal at the single first input 211 is output from a selected one of the multiple first outputs 212(1)-212(4) in response to some control signal (as discussed in greater detail below). The second RF switch 230 can have multiple second inputs 231(1)-231(4) and a single second output 232. Such a switch 230 can be configured so that a received signal at a selected one of the multiple second inputs 231(1)-231(4) is output from the single second output 232 in response to some control signal (as discussed in greater detail below). The first RF switch 210 and the second RF switch 230 can both be, for example, solid-state RF switches. Those skilled in the art will recognize that a "solid-state" device is a device that does not use moving components (e.g., mechanical devices) to perform an electrical function (e.g., switching, amplification, etc.) but instead uses semiconductor devices (e.g., transistors, diodes, etc.). Various solid-state RF switch configurations for single input/multi-output operation and for multi-input/single output operation are well known in the art and, thus, the details of such switches have been omitted from this specification in order to allow the reader to focus on the salient aspects of the disclosed embodiments. Optionally, the first RF switch 210 and the second RF switch 230 can be surface-mount solid-state switches. Those skilled in the art will recognize that a "surface-mount" device is a device that is mounted directly onto the surface of a printed circuit board (PCB).

The filter and amplification circuit 200 can further include multiple different signal paths 281-284, which electrically connect the multiple first outputs 212(1)-212(4) of the first RF switch 210 to the multiple second inputs 231(1)-231(4) of the second RF switch 230, respectively. Each of these signal paths 281-284 can include an amplifier 251-254, an optional low-pass filter 241-244, and a band pass filter 221-224 connected in series between a corresponding first output 212(1)-212(4) of the first RF switch 210 and a corresponding second input 231(1)-231(4) of the second RF switch 230. For purposes of this discussion, each of the signal paths 281, 282, 283 and 284 includes an input segment 281a, 282a, 283a, and 284a and an output segment 281b, 282b, 283b, and 284b. The input segment 281a, 282a, 283a, and 284a extends from the first RF switch 210 to the band pass filter 221, 222, 223 and 224 and the output segment 281b, 282b, 283b, and 284b that extends from the band pass filter 221, 222, 223 and 224 to the second RF switch 230.

The amplifiers 251-254 in the different signal paths 281-284 can be, for example, low noise amplifiers (LNA). The amplifiers 251-254 can be configured to supply a power gain of some fixed amount (e.g., 10 dB, 20 dB, etc.). The amplifiers 251-254 can be essentially identical. Optionally, the amplifiers 251-254 can be surface-mount LNAs (i.e., LNAs surface-mounted on a PCB).

The band pass filters 221-224 in the different signal paths 281-284 can be different from each other. Specifically, each band pass filter 281-284 can be configured to pass RF signals within one specific band and to suppress all other RF signals (i.e., to suppress RF signals outside that specific band). For example, the first signal path 281 can include a first band pass filter 221, which is configured to pass only RF signals within a first band A (e.g., 5-15 GHz) and to suppress all RF signals outside that first band A. The second signal path 282 can include a second band pass filter 222, which is configured to pass only RF signals within a second band B (e.g., 15-25 GHz) and to suppress all RF signals outside that second band B. The third signal path 283 can include a third band pass filter 223, which is configured to pass only RF signals within a third band C (e.g., 25-35 GHz) and to suppress all RF signals outside that third band C. The fourth signal path 284 can include a fourth band pass filter 224, which is configured to pass only RF signals within a fourth band D (e.g., 35-45 GHz) and to suppress all RF signals outside that fourth band D. The band pass filters can, for example, be cavity filters on the PCB. Such band pass filters are well known in the art and, thus, the details of such filters have been omitted from this specification in order to allow the reader to focus on the salient aspects of the disclosed embodiments.

The optional low pass filters 241-244 can be connected in series between the amplifiers 251-254 and the band pass filters 221-224, respectively, for improved matching. The low pass filters can be different from each other. For example, the first signal path 281 can include a first low pass filter 241, which is configured to pass only RF signals below a first cut-off frequency (e.g., below 15 GHz). The second signal path 282 can include a second low pass filter 242, which is configured to pass only RF signals below a second cut-off frequency (e.g., below 25 GHz). The third signal path 283 can include a third low pass filter 243, which is configured to pass only RF signals below a third cut-off frequency (e.g., below 35 GHz). The fourth signal path 284 can include a fourth low pass filter 244, which is configured to pass only RF signals below a fourth cut-off frequency (e.g., below 45 GHz). The low pass filters can, for example, be cavity filters on the PCB. Such low pass filters are well known in the art and, thus, the details of such filters have been omitted from this specification in order to allow the reader to focus on the salient aspects of the disclosed embodiments.

For purposes of illustration, the filter and amplification circuit 200 described above and illustrated in the FIG. 2A has four signal paths with four different band pass filters associated with four different bands. However, it should be understood that the figures and discussion thereof are not intended to be limiting. The bands and, thus, the band pass filters may alternatively cover different frequency ranges. Furthermore, the filter and amplification circuit may, alternatively, include any number of two or more signal paths with two or more different band pass filters covering two or more different frequency ranges, respectively, depending upon the application.

The filter and amplification circuit 200 can receive a radio frequency (RF) signal 202 (e.g., from an RF signal generator 201) at the single first input 211 of the first RF switch 210. This RF signal 202 can have a relatively low spurious-free dynamic ratio (SFDR). That is, the RF signal 202 can include a carrier signal at a specific frequency and multiple spurious signals at different frequencies with each spurious signal having an initial corresponding negative power ratio relative to the carrier signal and this power ratio can be relatively low (e.g., lower than −80 dBc, such as at −60 dBc or lower).

Figure 2B:
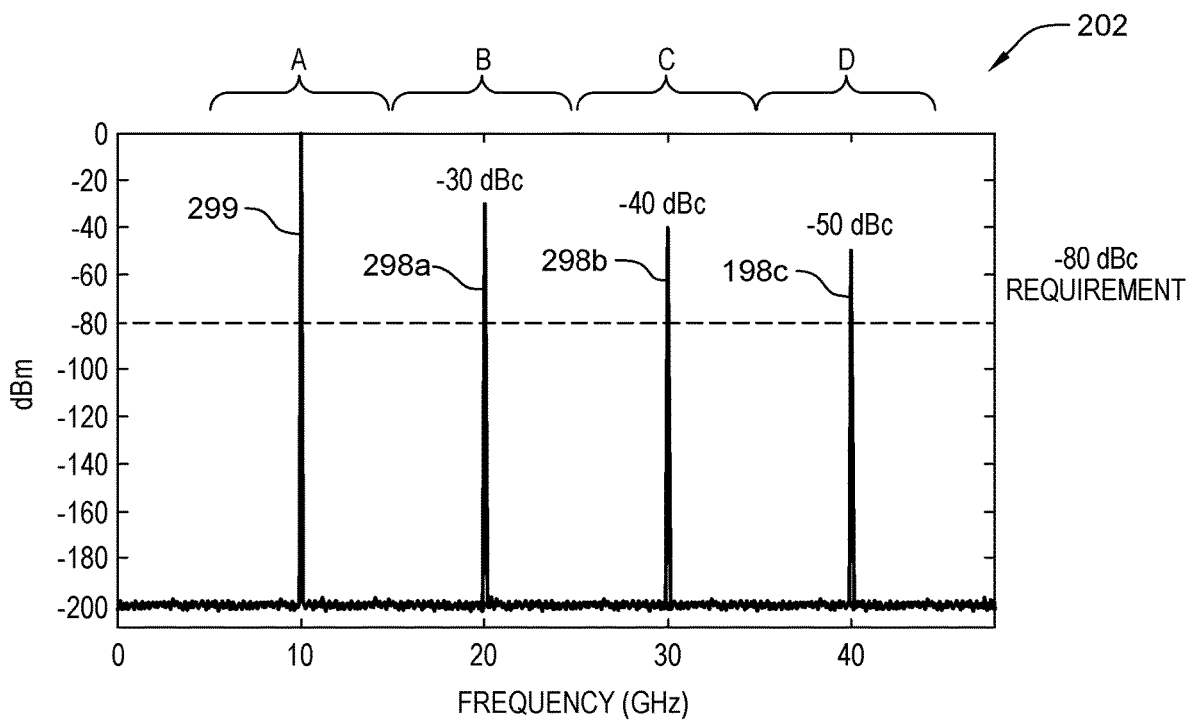
FIG. 2B is a graph illustrating an exemplary radio frequency (RF) signal, including carrier and spurious signals, input into the filter and amplification circuit of FIG. 2A.

For example, FIG. 2B is a graph illustrating an exemplary RF signal 202 that includes: a carrier signal 299 at 10 GHz; and three spurious signals including a first spurious signal 298a at 20 GHz with a −30 dBc power ratio relative to the carrier signal 299; a second spurious signal 298b at 30 GHz with a −40 dBc power ratio relative to the carrier signal 299; and a third spurious signal 298c at 40 GHz with a −50 dBc power ratio relative to the carrier signal 299. Thus, the power ratios of the spurious signals 298a-298c relative to the carrier signal 299 within in the RF signal 202 are lower than the minimum required −80 dBc and the RF signal 202 would not be considered to have a high spurious-free dynamic range (SFDR).

The filter and amplification circuit 200 can further receive a set of control signals (e.g., from a test system controller 291). The control signals can include, for example: a signal path select signal 270 received by both the first RF switch 210 and the second RF switch 230 and corresponding amplifier enable/disable signals 271-274 received by the amplifiers 251-254, respectively. In response to these control signals 270-274, the filter and amplification circuit 200 can perform a filtering operation on the received RF signal 202.

Specifically, the first RF switch 210 and the second RF switch can receive the signal path select signal 270, thereby causing a selected one of the signal paths (e.g., signal path 281) to be electrically connected to the single first input 211 of the first RF switch 210 and to the single second output 232 of the second RF switch 230, thereby establishing an active signal path. That is, in response to the signal path select signal 270, the first RF switch 210 electrically connects the single first input 211 to the appropriate one of the multiple outputs (e.g., 212(1)) and the second RF switch 230 concurrently electrically connects the appropriate one of the multiple inputs (e.g., 231(1)) to the single second output 232 such that the selected signal path 281 is directly electrically connected at one end to the single first input 211 and at the opposite end the single second output 232. It should be noted that the selected signal path will be that signal path that contains the specific band pass filter, which is configured to pass the carrier signal 299 and suppress the spurious signals 298a-298c of the RF signal 202. Thus, for example, since the carrier signal 299 shown in FIG. 2B has a specific frequency of 10 GHz, the selected signal path would be the first signal path 281 that includes the first band pass filter 221 because the first band pass filter is configured to pass all RF signals within the first band A of 5-15 GHz and to suppress all other RF signals.

It should be understood that the example RF signal 202 shown in FIG. 2B (where the carrier signal 299 is at 10 GHz and the spurious signals 298a-298c are at 20 GHz, 30 GHz and 40 GHz, respectively) is not intended to be limiting. For example, the carrier signal 299 could, alternatively, be within a different one of the bands and, thus, the signal path select signal 270 would be set so as to cause switching to the appropriate signal path. However, for purposes of illustration, the embodiments are described below with respect to a filtering operation performed by the filter and amplification circuit 200 with respect to this RF signal 202 such that the first signal path 281 is the selected signal path.

Additionally, the amplifiers 251-254 can receive their corresponding enable/disable signals 271-274. These enable/disable signals 271-274 should be set so as to cause the amplifier 251 in the selected signal path 281 to be enabled in response to its corresponding enable/disable signal 271 and so as to cause the amplifiers 252-254 in the non-selected signal paths 282-284 to be disabled in response to their corresponding enable/disable signals 272-274.

Figure 2C:
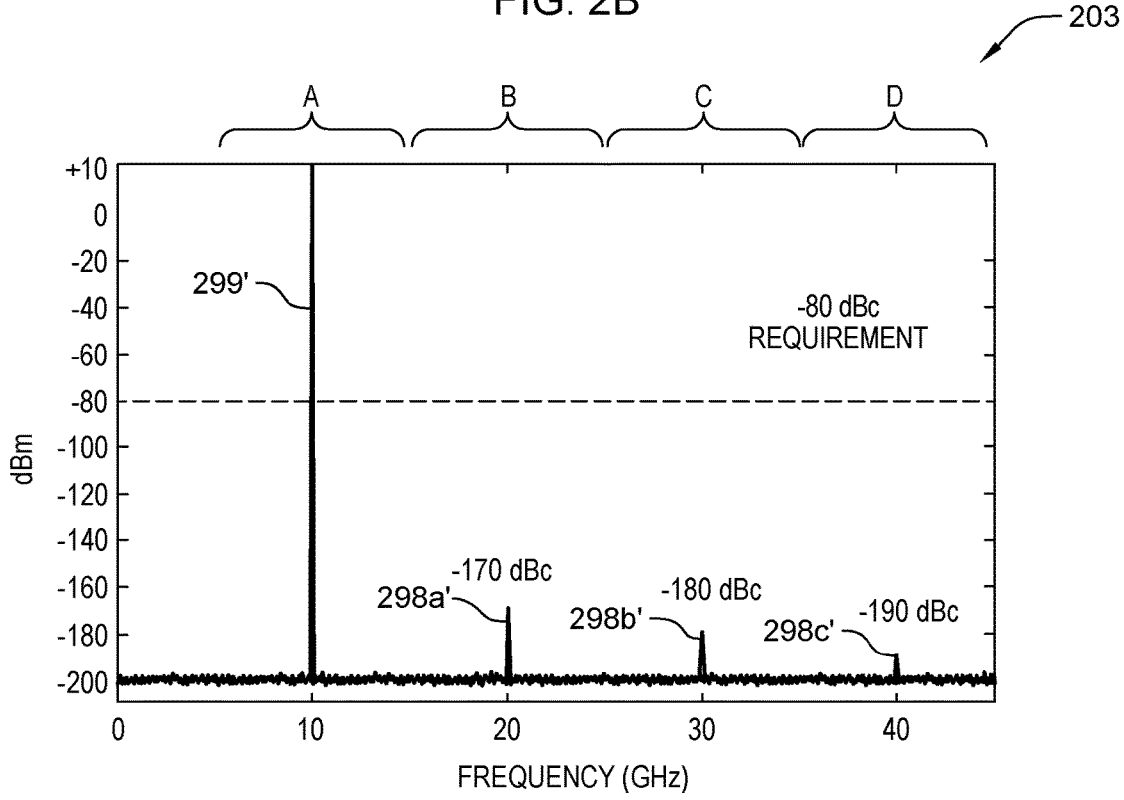
FIG. 2C is a graph illustrating an exemplary filtered RF signal, including an amplified and filtered carrier signal and filtered spurious signals, output from the filter and amplification circuit of FIG. 2A.

With this set up, signal filtering can be performed by the filter and amplification circuit 200 through the selected signal path 281 (which is active and has its amplifier 251 enabled) in combination with the non-selected signal paths 282-284 (which are passively coupled to the selected signal path and have their amplifiers 252-254 disabled) so that a filtered RF signal 203 is output at the single second output 232 of the second RF switch 230. As discussed in greater detail below, this filtered RF signal 203 will include an amplified and filtered carrier signal 299' at the same specific frequency as the original carrier signal 299 (e.g., at 10 GHz) and will further include multiple filtered spurious signals 298a'-298c' that are at the same frequencies as the original spurious signals 298a-298c (e.g., at 20 GHz, 30 GHz and 40 GHz, respectively) but each filtered spurious signal 298a'-298c' will have a higher corresponding negative power ratio relative the carrier signal as compared to the initial corresponding negative power ratio. The increased power ratios can be relatively high (e.g., at −80 dBc or higher), as shown in FIG. 2C.

More specifically, within the selected first signal path 281, the first amplifier 251 can receive the RF signal 202 and can generate and output an amplified RF signal and the first low pass filter 241 (if present) and the first band pass filter 221 can process the amplified RF signal such that the filtered RF signal 203 on the output segment 281b of the selected first signal path 281 includes an amplified and filtered carrier signal 299'. Due to processing by the first amplifier 251, the amplified and filtered carrier signal 299' will be at a higher power level than the original carrier signal 299. The higher power level will be equal to the power gain supplied by the amplifier 251 (e.g., 10 dB). Due to processing by the first band pass filter 221, this amplified and filtered carrier signal 299' will be within the first band A and, particularly, at the same specific frequency as the original carrier signal 299 (e.g., 10 GHz).

Furthermore, the input segments 282a, 283a, 284a of the non-selected signal paths 282, 283, 284 can each be passively coupled to the input segment 281a of the selected signal path 281 such that the RF signal 202 is also received by those input segments 282a, 283a, 284a. As discussed in greater detail below, there will be some amount of isolation-caused power loss associated with the passive transmission of the RF signal 202 from the input segment 281a of the selected first signal path 281 to the input segments 282a, 283a and 284a of the non-selected second, third and fourth signal paths 282, 283, and 284. In any case, within each non-selected signal path 282-284, the disabled amplifier forwards the RF signal 202 without amplification to the band pass filter (via a low pass filter, if present) and the band pass filter processes the RF signal such that the output of the band pass filter in each non-selected signal path is a filtered (but not amplified) spurious signal. That is, within the non-selected second signal path 282, the disabled second amplifier 252 can forward the RF signal 202 without amplification to the second band pass filter 222 (via the second low pass filter 242 if present) and the second band pass filter 222 can process the RF signal 202 such that the output of the second band pass filter 222 in the non-selected second signal path 282 is a filtered (but not amplified) spurious signal 298a within the second band B (e.g., at 20 GHz). Within the non-selected third signal path 283, the disabled third amplifier 253 can forward the RF signal 202 without amplification to the third band pass filter 223 (via the third low pass filter 243 if present) and the third band pass filter 223 can process the RF signal 202 such that the output of the third band pass filter 223 in the non-selected third signal path 283 is a filtered (but not amplified) spurious signal 298b within the third band C (e.g., at 30 GHz). Within the non-selected fourth signal path 284, the disabled third amplifier 254 can forward the RF signal 202 without amplification to the fourth band pass filter 224 (via the third low pass filter 244 if present) and the fourth band pass filter 224 can process the RF signal 202 such that the output of the fourth band pass filter 224 in the non-selected fourth signal path 284 is a filtered (but not amplified) spurious signal 298c within the fourth band D (e.g., at 40 GHz).

Finally, the output segments 282b, 283b, 284b of the non-selected signal paths 282, 283, 284 can each also be passively coupled to the output segment 281b of the selected signal path such that the filtered spurious signals 298a, 298b, 298c from the non-selected signal paths 282, 283, 284 are received at the output segment 281b of the selected first signal path 281. As discussed below, there will be isolation-caused power loss associated with the passive transmission of the filtered spurious signals 298a, 298b and 298c from the output segments 282b, 283b, and 284b to the output segment 281b of the selected first signal path 281. In any case, the filtered RF signal 203 on the output segment 281b of the selected first signal path 281 will include, not only the amplified and filtered carrier signal 299', but also the multiple filtered spurious signals 298a, 298b, and 298c.

In the filter and amplification circuit 200, there will be some amount of isolation-caused power loss associated with the passive transmission of the RF signal 202 from the input segment 281a of the selected first signal path 281 to the input segments 282a, 283a and 284a of the non-selected second, third and fourth signal paths 282, 283, and 284. The isolation is provided by the first RF switch 210, by the first amplifier 251 that is enabled in the selected signal path 281, and by the amplifier that is disabled in the non-selected signal path receiving the RF signal 202. Additionally, there will be some amount of isolation-caused power loss associated with passive transmission of each of the filtered spurious signals 298a, 298b and 298c from the output segments 282b, 283b, and 284b of the non-selected signal paths 282, 283 and 284 to the output segment 281b of the selected first signal path 281. The isolation is provided by the second RF switch 230.

In the exemplary filter and amplification circuit 200, the amount of isolation provided by the first RF switch 210 (e.g., a first solid-state RF switch) could be 20 dB, the amount of isolation (gain) provided by the enabled amplifier can be 10 dB, the amount of isolation provided by a disabled amplifier can be 90 dB, and the amount of isolation provided by the second RF switch 230 (e.g., a second solid-state RF switch) can be 20 dB. Thus, the total increase of the negative power ratio any given one of the filtered spurious signals 298a', 298b', and 298c' in the filtered RF signal 203 relative to the original carrier signal 299 due to the combined isolation amounts provided by these components will be 140 dB (i.e., 20 dB+10 dB+90 dB+20 dB). Consequently, as illustrated in FIG. 2C, the filtered RF signal 203 will include: the amplified and filtered carrier signal 299', which as discussed above will be amplified relative to the original carrier signal 299 by the power gain of the enabled amplifier, e.g., by 10 dB); and also the filtered spurious signals 298a', 298b', and 298c', which are all now at lower power levels and, more particularly, which all now have negative power ratios relative to the original carrier signal that are −170 dBc, −180 dBc and −190 dBc, respectively. Thus, the filtered RF signal 203 is a 5G UWB RF signal with a high SFDR (i.e., with an SFDR of −80 dBc or higher).

It should be noted that in prior art filter circuits, such as in the filter circuit 100 shown in FIG. 1, the electromechanical RF switches cannot simply be replaced by solid state switches and still achieve the desired SFDR because the solid-state switches do not provide a sufficient amount of isolation. For example, a solid-state switch may provide 20 dB as compared to 60 dB for an electromechanical switch. In the disclosed filter and amplification circuit 200 the amplifiers enable amplification of the carrier signal and also provide a significant amount of isolation so that solid-state RF switches can be employed and the desired SFDR can still be achieved. By using surface-mount solid-state RF switches 210 and 230 (as opposed to electromechanical RF switches) in combination surface-mount amplifiers 251-254 within the different signal paths 281-284, both the cost and the overall size of the filter and amplification circuit 200 can be reduced relative to prior art filter circuits. Other advantages of the filter and amplification circuit 200 include, but are not limited to, the fact that the switching speed can be increased because hot switching is now available (i.e., a previously selected signal path can be de-selected concurrently with selecting a new signal path) and solid state switches switching speeds are at least 4 to 5 orders of magnitude higher than electromechanical switches, the power level of the carrier signal can be increased by the enabled amplifier in the selected signal path, audible switching noises can be eliminated, and the SFDR can be further increased.

As mentioned above, some devices that are incorporated into 5G wireless communication networks (e.g., RF integrated circuits (ICs) and analog-to-digital converters (ADCs) with very high data rates at 64 GSPS or more) have test specifications requiring the use of a 5G UWB RF signal with a high spurious-free dynamic range (SFDR) (i.e., with an SFDR of −80 dBc or higher). Thus, also disclosed herein are embodiments of a test system 290 that incorporates the above-described filter and amplification circuit 200. As illustrated in FIG. 2A, the test system 290 can include a device under test (DUT) 205, a radio frequency (RF) signal generator 201, a filter and amplification circuit 200, and a controller 291. The controller 291 can be, for example, a computer system, which is in communication with the other test system components (e.g., the circuit 200, the RF signal generator 201 and the DUT 205) and which controls (i.e., is adapted to control, is configured to control, executes a program of instructions to control, etc.) these other test components during testing of the DUT 205.

Specifically, the RF signal generator 201 can receive one or more control signals from the controller 291 and, in response to the control signal(s), can generate and output (i.e., can be adapted to generate and output, configured to generate and output, etc.) a radio frequency (RF) signal 202. The RF signal 202 can be generated so that it includes a carrier signal 299 at a specific frequency, which is set by the controller 291 at the required frequency for use in testing the DUT 205. Typically, the RF signal 202 will also be generated so as to include multiple spurious signals 298*a*-298*c* at different frequencies with each spurious signal having an initial corresponding negative power ratio relative to the carrier signal that is relatively low (e.g., lower than −80 dBc, such as at −60 dBc or lower). Thus, this RF signal 202 may have a relatively low SFDR. See detailed discussion of FIG. 2B above. RF signal generators are well known in the art and, thus, the details thereof have been omitted from this specification in order to allow the reader to focus on the salient aspects of the disclosed embodiments.

The filter and amplification circuit 200 can be electrically connected to the RF signal generator 201. Specifically, as mentioned above, the filter and amplification circuit 200 can include a single input/multi-output first switch 210 (e.g., a surface-mount solid-state RF switch), a multi-input/single output second switch 230 (e.g., a surface-mount solid-state RF switch), and multiple signal paths (each with an amplifier, bandpass filter and optional low pass filter between the amplifier and bandpass filter) that extend between the outputs of the first switch to the inputs of the second switch. The single first input 211 of the first RF switch 210 can be electrically connected to the RF signal generator 201 for receiving the RF signal 202.

The filter and amplification circuit 200 can further receive a set of control signals from the controller 291. The control signals can include, for example: a signal path select signal 270 received by both the first RF switch 210 and the second RF switch 230 and corresponding amplifier enable/disable signals 271-274 received by the amplifiers 251-254, respectively. In response to these control signals 270-274, the filter and amplification circuit 200 can perform a filtering operation on the received RF signal 202.

Specifically, the signal path select signal 270 can be received by the first and second RF switches 210 and 230 from the controller 291 and can indicate the specific signal path (referred to herein as the selected signal path) that contains the specific band pass filter that will pass the carrier signal and suppress the spurious signals of the RF signal 202. Receipt of this signal path select signal 270 can cause the first and second RF switches 210 and 230 to electrically connect the selected signal path to the single first input 211 of the first RF switch 210 and to the single second output 232 of the second RF switch, thereby establishing an active signal path. That is, the first RF switch 210 electrically connects the single first input 211 to the appropriate one of the multiple outputs and the second RF switch 230 concurrently electrically connects the appropriate one of the multiple inputs to the single second output 232 such that the selected signal path is directly electrically connected at one end to the single first input 211 and at the opposite end the single second output 232. Additionally, the enable/disable signals 271-274 can be received by the amplifiers 251-254 and can be set (e.g., by the controller 291) so as to cause the amplifier 251 in the selected signal path 281 to be enabled and the amplifiers 252-254 in the non-selected signal paths 282-284 to be disabled.

The filtering operation can then be performed through the selected signal path 281 (which is active and has its amplifier 251 enabled) in combination with non-selected signal paths 282-284 (which are passively coupled to the selected signal path and have their amplifiers 252-254 disabled) so that a filtered RF signal 203 is generated and output from the single second output 232 of the second RF switch 230. The filtered RF signal 203 will include an amplified and filtered carrier signal 299' at the same specific frequency as the original carrier signal and multiple filtered spurious signals 298*a*'-298*c*' at the same frequencies as the original spurious signals but with each filtered spurious signal having a higher corresponding negative power ratio relative the carrier signal as compared to the initial corresponding negative power ratio). See the detailed discussion of FIG. 2C above. Thus, the filtered RF signal 205 will have a high SFDR.

The DUT 205 can be, for example, an RFIC, an ADC, or any other type of DUT that requires a 5G UWB RF signal with a high SFDR. The DUT 205 can receive the filtered RF signal 203 output from the single second output 232 of the second RF switch 230 of the filter and amplification circuit 200. The DUT 205 can further receive one or more control signals from the controller and, in response to the received RF signal 203 and the control signal(s), the DUT 205 can undergo testing. Test systems that perform testing of a DUT (such as an RFIC or ADC) using an RF signal and various control signals are well known in the art and, thus, the details of testing have been omitted from this specification in order to allow the reader to focus on the salient aspects of the disclosed embodiments.

Figure 3:
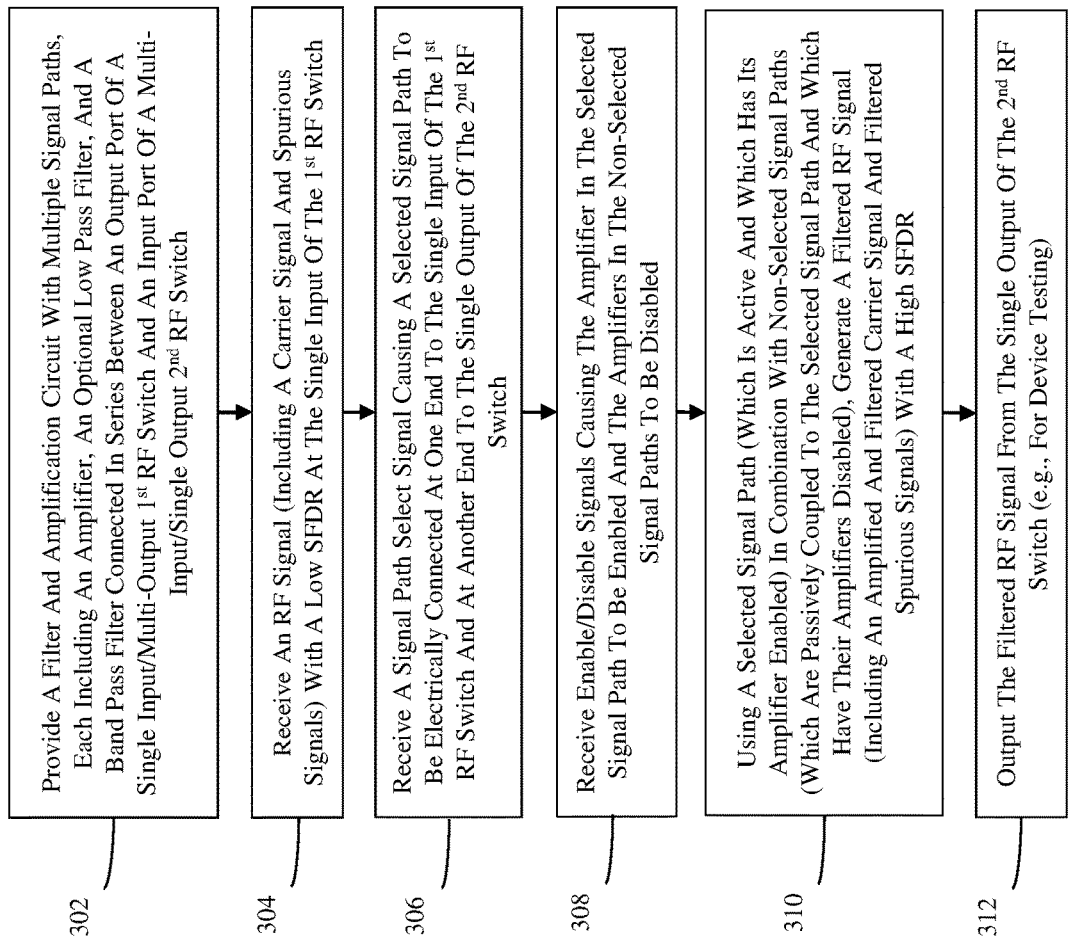
FIG. 3 is a flow diagram illustrating disclosed method embodiments associated with the filter and amplification circuit and with the test system that incorporates the filter and amplification circuit.

Referring to the flow diagram of FIG. 3, also disclosed herein are method embodiments associated with the above-described radio frequency (RF) signal filter and amplification circuit 200 and test system 290 that includes the filter and amplification circuit 200. Specifically, the method can include providing a filter and amplification circuit 200, as described in detail above and illustrated in FIG. 2A (see process step 302). This filter and amplification circuit 200 can, for example, be incorporated into a test system 290 along with an RF signal generator 201, a device under test (DUT) 205 (e.g., an RFIC, an ADC, or any other type of DUT that requires a 5G UWB RF signal with a high SFDR), and a controller 291, which is in communication with and controls the RF signal generator 201, the filter and amplification circuit 200, and the DUT 205.

The method can further include receiving, at the single first input 211 of the first RF switch 210 of the filter and amplification circuit 200 from the RF signal generator 201, an RF signal 202 (see process step 304). This RF signal 202 can, as illustrated in FIG. 2B and described in detail above, include carrier signal 299 at a specific frequency. The specific frequency of the carrier signal 299 can set (e.g., by the controller 291) to the required frequency for use in testing the DUT 205. The RF signal 202 can also have multiple spurious signals 298a-298c at different frequencies with each spurious signal having an initial low corresponding negative power ratio relative to the carrier signal (e.g., lower than −80 dBc). Thus, the RF signal 202 can have a relatively low SFDR.

The method can further include filtering, by the filter and amplification circuit 200, of the RF signal 202. This filtering process can include receiving, at the first and second RF switches 210 and 230 from the controller 291, a signal path select signal 270, which indicates the specific signal path (referred to herein as the selected signal path) that contains the specific band pass filter that will pass the carrier signal 299 and suppress the spurious signals 298a-298c of the RF signal 202 (see process step 306). Receipt of this signal path select signal 270 can cause the first and second RF switches 210 and 230 to electrically connect the selected signal path to the single first input 211 of the first RF switch 210 and to the single second output 232 of the second RF switch, thereby establishing an active signal path. That is, the first RF switch 210 electrically connects the single first input 211 to the appropriate one of the multiple outputs and the second RF switch 230 concurrently electrically connects the appropriate one of the multiple inputs to the single second output 232 such that the selected signal path is directly electrically connected at one end to the single first input 211 and at the opposite end the single second output 232.

This filtering process can further include receiving, by the amplifiers 251-254 from the controller 291, their corresponding enable/disable signals 271-274 (see process step 308). These enable/disable signals 271-274 should be set so that receipt of the signals 271-274 causes the amplifier 251 in the selected signal path 281 to be enabled and the amplifiers 252-254 in the non-selected signal paths 282-284 to be disabled.

This filtering process can further include using the selected signal path 281 (which is active and has its amplifier 251 enabled) in combination with the non-selected signal paths 282-284 (which are passively coupled to the selected signal path and have their amplifiers 252-254 disabled) to filter the RF signal 202 and, thereby generate and output a filtered RF signal 203 at the single second output 232 of the second RF switch 230 (see process step 310). This filtered RF signal 203, as described in detail above and illustrated in FIG. 2C, can include an amplified and filtered carrier signal 299' at the same specific frequency as the original carrier signal 299 and can further include multiple filtered spurious signals 298a'-298c' at the same frequencies as the original spurious signals 298a-298c but with each filtered spurious signal 298a'-298c' having a higher corresponding negative power ratio relative the carrier signal as compared to the initial corresponding negative power ratio, as in FIG. 2C. This increased power ratio can be relatively high (e.g., at −80 dBc or higher).

The method can further include forwarding the filtered RF signal 203 to the DUT 205 for use during device testing (see process step 312).

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration and are not intended to be exhaustive. The present invention is not limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A filter and amplification circuit comprising:
a first switch with a single first input and multiple first outputs;
a second switch with multiple second inputs and a single second output; and
multiple different signal paths electrically connecting the multiple first outputs to the multiple second inputs, respectively,
wherein each signal path of the different signal paths comprises an amplifier, and a band pass filter connected in series between a corresponding first output of the multiple first outputs of the first switch and a corresponding second input of the multiple second inputs of the second switch with the amplifier being connected between the corresponding first output and the band pass filter and with the band pass filter connected between the amplifier and the corresponding second input,
wherein the different signal paths comprise different band pass filters that pass radio frequency signals within different bands, respectively, and
wherein each signal path further comprises a low-pass filter connected in series between the amplifier and the band pass filter for improved matching.

2. The filter and amplification circuit of claim 1,
wherein the first switch and the second switch receive a signal path select signal that causes a selected signal path of the multiple different signal paths to be electrically connected to the single first input of the first switch and to the single second output of the second switch, and
wherein, concurrently with receipt of the signal path select signal by the first switch and the second switch, the amplifier in the selected signal path and each amplifier in each non-selected signal path receive corresponding enable/disable signals that cause the amplifier in the selected signal path to be enabled and each amplifier in each non-selected signal path to be disabled.

3. The filter and amplification circuit of claim 2,
wherein the single first input of the first switch receives a radio frequency signal,
wherein the radio frequency signal comprises a carrier signal at a specific frequency and multiple spurious signals at different frequencies with each spurious signal having an initial corresponding negative power ratio relative to the carrier signal,
wherein the filter and amplification circuit performs filtering of the radio frequency signal such that a filtered radio frequency signal is output at the single second output of the second switch, and
wherein the filtered radio frequency signal comprises an amplified and filtered carrier signal at the specific frequency and multiple filtered spurious signals at the different frequencies with each filtered spurious signal having a higher corresponding negative power ratio relative to the carrier signal as compared to the initial corresponding negative power ratio.

4. The filter and amplification circuit of claim 3, wherein, during the filtering:
within the selected signal path, the amplifier receives the radio frequency signal and generates an amplified radio frequency signal and the band pass filter processes the amplified radio frequency signal such that the filtered radio frequency signal at an output segment of the selected signal path includes the amplified and filtered carrier signal at the specific frequency;
each non-selected signal path is passively coupled to the selected signal path such that the radio frequency signal is further received at an input segment of each non-elected signal path;
within each non-selected signal path, a disabled amplifier forwards the radio frequency signal to the band pass filter and the band pass filter processes the radio frequency signal such that an output of the band pass filter in each non-selected signal path is a filtered spurious signal at a corresponding one of the different frequencies; and
each non-selected signal path is passively coupled to the selected signal path such that each filtered spurious signal is received at the output segment of the selected signal path and the filtered radio frequency signal further includes the multiple filtered spurious signals.

5. The filter and amplification circuit of claim 4, wherein the higher corresponding negative power ratio of a given filtered spurious signal is due to isolation between the selected signal path and a given non-selected signal path that generates the given filtered spurious signal and wherein the isolation is provided by the first switch, the amplifier that is enabled in the selected signal path, the amplifier that is disabled in the given non-selected signal path, and the second switch.

6. The filter and amplification circuit of claim 5, wherein a portion of the isolation provided by the amplifier that is enabled in the selected signal path is less than a portion of the isolation provided by the amplifier that is disabled in the given non-selected signal path.

7. The filter and amplification circuit of claim 1, wherein the first switch is a first solid-state switch, wherein the second switch is a second solid-state switch, and wherein the first solid-state switch, the second solid-state switch and all amplifiers in the multiple different signal paths are surface-mount devices.

8. The filter and amplification circuit of claim 1, wherein each amplifier comprises a low-noise amplifier.

9. A test system comprising:
a radio frequency signal generator generating and outputting a radio frequency signal, wherein the radio frequency signal comprises: a carrier signal at a specific frequency and multiple spurious signals at different frequencies with each spurious signal having an initial corresponding negative power ratio relative to the carrier signal; and
a filter and amplification circuit receiving the radio frequency signal from the radio frequency signal generator, filtering the radio frequency signal, and outputting a filtered radio frequency signal to a device under test,
wherein the filtered radio frequency signal comprises: an amplified and filtered carrier signal at the specific frequency and multiple filtered spurious signals at the different frequencies with each filtered spurious signal having a higher corresponding negative power ratio relative the carrier signal as compared to the initial corresponding negative power ratio, and
wherein the filter and amplification circuit comprises:

a first switch with a single first input and multiple first outputs, wherein the single first input receives the radio frequency signal;

a second switch with multiple second inputs and a single second output, wherein the single second output outputs the filtered radio frequency signal; and multiple different signal paths electrically connecting the multiple first outputs to the multiple second inputs, respectively, wherein each signal path comprises an amplifier and a band pass filter connected in series between a corresponding first output of the first switch and a corresponding second input of the second switch, and wherein the different signal paths comprise different band pass filters that pass radio frequency signals within different bands, respectively.

10. The test system of claim 9, further comprising a controller, wherein the first switch and the second switch receive a signal path select signal from the controller causing a selected signal path of the multiple different signal paths to be electrically connected to the single first input of the first switch and to the single second output of the second switch, and wherein, concurrently with receipt of the signal path select signal by the first switch and the second switch, the amplifier in the selected signal path and each amplifier in each non-selected signal path receive corresponding enable/disable signals from the controller causing the amplifier in the selected signal path to be enabled and causing each amplifier in each non-selected signal path to be disabled.

11. The test system of claim 9, wherein the device under test comprises a radio frequency integrated circuit.

12. The test system of claim 9, wherein the device under test comprises an analog-to-digital converter.

13. A method comprising:

receiving, by a filter and amplification circuit from a radio frequency signal generator, a radio frequency signal comprising a carrier signal at a specific frequency and multiple spurious signals at different frequencies with each spurious signal having an initial corresponding negative power ratio relative to the carrier signal; and filtering, by the filter and amplification circuit, of the radio frequency signal to output a filtered radio frequency signal that comprises an amplified and filtered carrier signal at the specific frequency and multiple filtered spurious signals at the different frequencies with each filtered spurious signal having a higher corresponding negative power ratio relative the carrier signal as compared to the initial corresponding negative power ratio.

14. The method of claim 13, further comprising forwarding the filtered radio frequency signal to a device under test.

15. The method of claim 13, wherein the filter and amplification circuit comprises:

a first switch with a single first input and multiple first outputs;

a second switch with multiple second inputs and a single second output; and multiple different signal paths electrically connecting the multiple first outputs to the multiple second inputs, respectively, wherein each signal path comprises an amplifier and a band pass filter connected in series between a corresponding first output of the first switch and a corresponding second input of the second switch, and wherein the different signal paths comprise different band pass filters that pass radio frequency signals within different bands, respectively.

16. The method of claim 15, wherein the filtering of the radio frequency signal comprises:

receiving the radio frequency signal at the single first input of the first switch;

electrically connecting a selected signal path of the multiple different signal paths to the single first input of the first switch and to the single second output of the second switch such that the radio frequency signal is applied directly to an input segment of the selected signal path;

enabling the amplifier in the selected signal path, wherein, within the selected signal path, the amplifier receives the radio frequency signal and generates an amplified radio frequency signal and the band pass filter processes the amplified radio frequency signal such that the filtered radio frequency signal at an output segment of the selected signal path includes the amplified and filtered carrier signal at the specific frequency; and disabling each amplifier in each non-selected signal path,
wherein each non-selected signal path is passively coupled to the selected signal path such that the radio frequency signal is further received at an input segment of each non-elected signal path, wherein, within each non-selected signal path, a disabled amplifier forwards the radio frequency signal to the band pass filter and the band pass filter processes the radio frequency signal such that an output of the band pass filter in each non-selected signal path is a filtered spurious signal at a corresponding one of the different frequencies, wherein each non-selected signal path is passively coupled to the selected signal path such that each filtered spurious signal is received at the output segment of the selected signal path and the filtered radio frequency signal includes the multiple filtered spurious signals, wherein the higher corresponding negative power ratio of a given filtered spurious signal in the filtered radio frequency signal is due to isolation between the selected signal path and a given non-selected signal path that generates the given filtered spurious signal, and wherein the isolation is provided by the first switch, the amplifier that is enabled in the selected signal path, the amplifier that is disabled in the given non-selected signal path, and the second switch.

17. The method of claim 16, wherein a portion of the isolation provided by the amplifier that is enabled in the selected signal path is less than a portion of the isolation provided by the amplifier that is disabled in the given non-selected signal path.

18. The method of claim 15, wherein the first switch is a first solid-state switch, wherein the second switch is a second solid-state switch, and wherein the first solid-state switch, the second solid-state switch and all amplifiers in the multiple different signal paths are surface-mount devices.

19. The method of claim 15, wherein each signal path further comprises a low-pass filter connected in series between the amplifier and the band pass filter for improved matching.

* * * * *